US010805567B2

(12) United States Patent
Parks

(10) Patent No.: US 10,805,567 B2
(45) Date of Patent: Oct. 13, 2020

(54) IMAGING PIXELS WITH NON-DESTRUCTIVE READOUT CAPABILITIES

(71) Applicant: SEMICONDUCTOR COMPONENTS INDUSTRIES, LLC, Phoenix, AZ (US)

(72) Inventor: Christopher Parks, Pittsford, NY (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 224 days.

(21) Appl. No.: 16/130,118

(22) Filed: Sep. 13, 2018

(65) Prior Publication Data

US 2020/0092502 A1 Mar. 19, 2020

(51) Int. Cl.
*H04N 5/378* (2011.01)
*H01L 27/146* (2006.01)

(52) U.S. Cl.
CPC ......... *H04N 5/378* (2013.01); *H01L 27/1463* (2013.01); *H01L 27/14614* (2013.01); *H01L 27/14643* (2013.01)

(58) Field of Classification Search
CPC ............ H01L 27/146; H01L 27/14614; H01L 27/14616; H01L 27/14612; H01L 27/1461; H01L 27/14609; H01L 27/14601; H01L 27/1463; H01L 27/14643; H04N 5/378; H04N 5/379; H04N 5/374; H04N 5/369
See application file for complete search history.

(56) References Cited

U.S. PATENT DOCUMENTS

| 5,541,402 A * | 7/1996 | Ackland | H04N 5/37452 250/208.1 |
| 6,021,172 A * | 2/2000 | Fossum | G11C 19/282 257/239 |
| 6,310,369 B1 * | 10/2001 | Narabu | G11C 19/285 257/239 |
| 6,414,342 B1 * | 7/2002 | Rhodes | H01L 27/14601 257/249 |
| 9,029,750 B1 * | 5/2015 | Bluzer | H01L 27/04 250/208.1 |

(Continued)

OTHER PUBLICATIONS

Krymski, "A Global Shutter Pixel with Floating Storage Gate"; Proc. of IISW, 2013, pp. 401-404.

(Continued)

*Primary Examiner* — John R Lee
(74) *Attorney, Agent, or Firm* — Treyz Law Group, P.C.; Joseph F. Guihan

(57) ABSTRACT

An image sensor may include imaging pixels with non-destructive readout capabilities. Each imaging pixel may include a substrate having a photosensitive area that generates charge in response to incident light. The charge may accumulate at a front side of the substrate adjacent to a floating gate. The voltage of the floating gate may depend on how much charge is accumulated. The voltage of the floating gate may be repeatedly sampled to monitor the amount of incident light received over time. A first reset transistor may clear the substrate of accumulated charge. A second reset transistor may reset the voltage of the floating gate. The imaging pixel may be split between multiple wafers if desired and may include nMOS and pMOS transistors.

21 Claims, 14 Drawing Sheets

(56) References Cited

U.S. PATENT DOCUMENTS

| | | | | |
|---|---|---|---|---|
| 2001/0002848 | A1* | 6/2001 | Fossum | H01L 27/14843 |
| | | | | 348/311 |
| 2004/0051801 | A1* | 3/2004 | Iizuka | H04N 5/37452 |
| | | | | 348/294 |
| 2004/0160522 | A1* | 8/2004 | Fossum | H01L 27/14645 |
| | | | | 348/308 |
| 2006/0146159 | A1* | 7/2006 | Farrier | H04N 5/3745 |
| | | | | 348/308 |
| 2007/0187724 | A1* | 8/2007 | Kaufmann | H01L 27/14603 |
| | | | | 257/239 |
| 2009/0122173 | A1* | 5/2009 | Tennant | H04N 5/374 |
| | | | | 348/308 |
| 2010/0231769 | A1* | 9/2010 | Shizukuishi | H01L 27/14623 |
| | | | | 348/306 |
| 2011/0273603 | A1* | 11/2011 | Suzuki | H04N 5/37213 |
| | | | | 348/311 |
| 2016/0037111 | A1* | 2/2016 | Dai | H04N 5/376 |
| | | | | 250/208.1 |
| 2017/0195602 | A1* | 7/2017 | Iwabuchi | H01L 27/14634 |
| 2017/0201698 | A1 | 7/2017 | Parks | |
| 2017/0257578 | A1* | 9/2017 | Velichko | H04N 5/2357 |
| 2020/0092502 | A1* | 3/2020 | Parks | H01L 27/14643 |
| 2020/0119083 | A1* | 4/2020 | Parks | H04N 5/372 |

OTHER PUBLICATIONS

Janesick et al., "New Advancements in Charge-Coupled Device Technology—Sub-Electron Noise and 4096X4096 Pixel CDS"; Proceedings of the Conference held Sep. 6-8, 1989 in Tucson, AZ. Astronomical Society of the Pacific Conference Series, vol. 8. San Francisco: Astronomical Society of the Pacific, 1990, p. 18-39.

\* cited by examiner

IMAGING PIXELS WITH NON-DESTRUCTIVE READOUT CAPABILITIES

BACKGROUND

This relates generally to image sensors and, more particularly, to image sensors having imaging pixels with non-destructive readout capabilities.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Each pixel receives incident photons (light) and converts the photons into electrical signals. Column circuitry is coupled to each pixel column for reading out pixel signals from the image pixels. Image sensors are sometimes designed to provide images to electronic devices using a Joint Photographic Experts Group (JPEG) format.

Conventionally, charge is destructively read out from the floating diffusion region. This only allows for one readout of charge from the photodiode, which may limit the functionality of the imaging pixel.

It would therefore be desirable to provide improved imaging pixels for image sensors.

DETAILED DESCRIPTION

Figure 1:
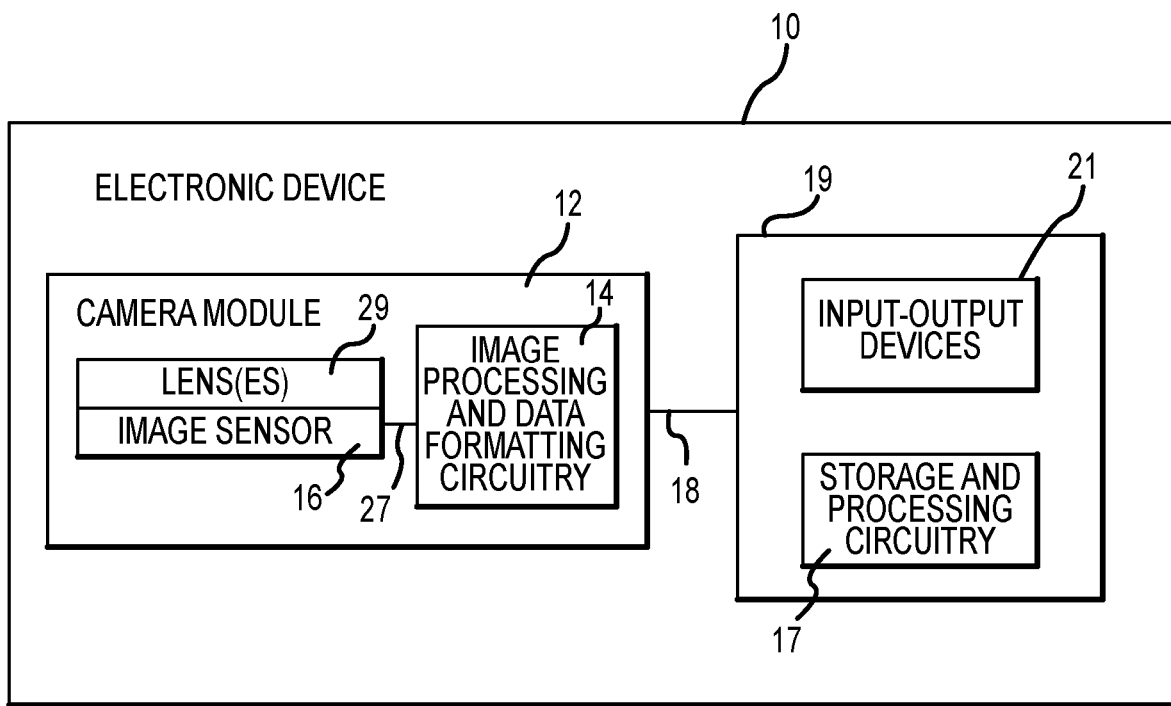
FIG. 1 is a schematic diagram of an illustrative electronic device that may include an image sensor in accordance with an embodiment.

Embodiments of the present invention relate to image sensors with imaging pixels that have non-destructive readout capabilities. An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 16 and one or more lenses 29. During operation, lenses 29 (sometimes referred to as optics 29) focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 16 may be provided to image processing and data formatting circuitry 14 via path 27. Image processing and data formatting circuitry 14 may be used to perform image processing functions such as automatic focusing functions, depth sensing, data formatting, adjusting white balance and exposure, implementing video image stabilization, face detection, etc. For example, during automatic focusing operations, image processing and data formatting circuitry 14 may process data gathered by phase detection pixels in image sensor 16 to determine the magnitude and direction of lens movement (e.g., movement of lens 29) needed to bring an object of interest into focus.

Image processing and data formatting circuitry 14 may also be used to compress raw camera image files if desired (e.g., to Joint Photographic Experts Group or JPEG format). In a typical arrangement, which is sometimes referred to as a system on chip (SOC) arrangement, camera sensor 16 and image processing and data formatting circuitry 14 are implemented on a common integrated circuit. The use of a single integrated circuit to implement camera sensor 16 and image processing and data formatting circuitry 14 can help to reduce costs. This is, however, merely illustrative. If desired, camera sensor 14 and image processing and data formatting circuitry 14 may be implemented using separate integrated circuits. If desired, camera sensor 16 and image processing circuitry 14 may be formed on separate semiconductor substrates. For example, camera sensor 16 and image processing circuitry 14 may be formed on separate substrates that have been stacked.

Camera module 12 may convey acquired image data to host subsystems 19 over path 18 (e.g., image processing and data formatting circuitry 14 may convey image data to subsystems 19). Electronic device 10 typically provides a user with numerous high-level functions. In a computer or advanced cellular telephone, for example, a user may be provided with the ability to run user applications. To implement these functions, host subsystem 19 of electronic device 10 may include storage and processing circuitry 17 and input-output devices 21 such as keypads, input-output ports, joysticks, and displays. Storage and processing circuitry 17 may include volatile and nonvolatile memory (e.g., random-access memory, flash memory, hard drives, solid state drives, etc.). Storage and processing circuitry 17 may also include microprocessors, microcontrollers, digital signal processors, application specific integrated circuits, or other processing circuits.

Figure 2:
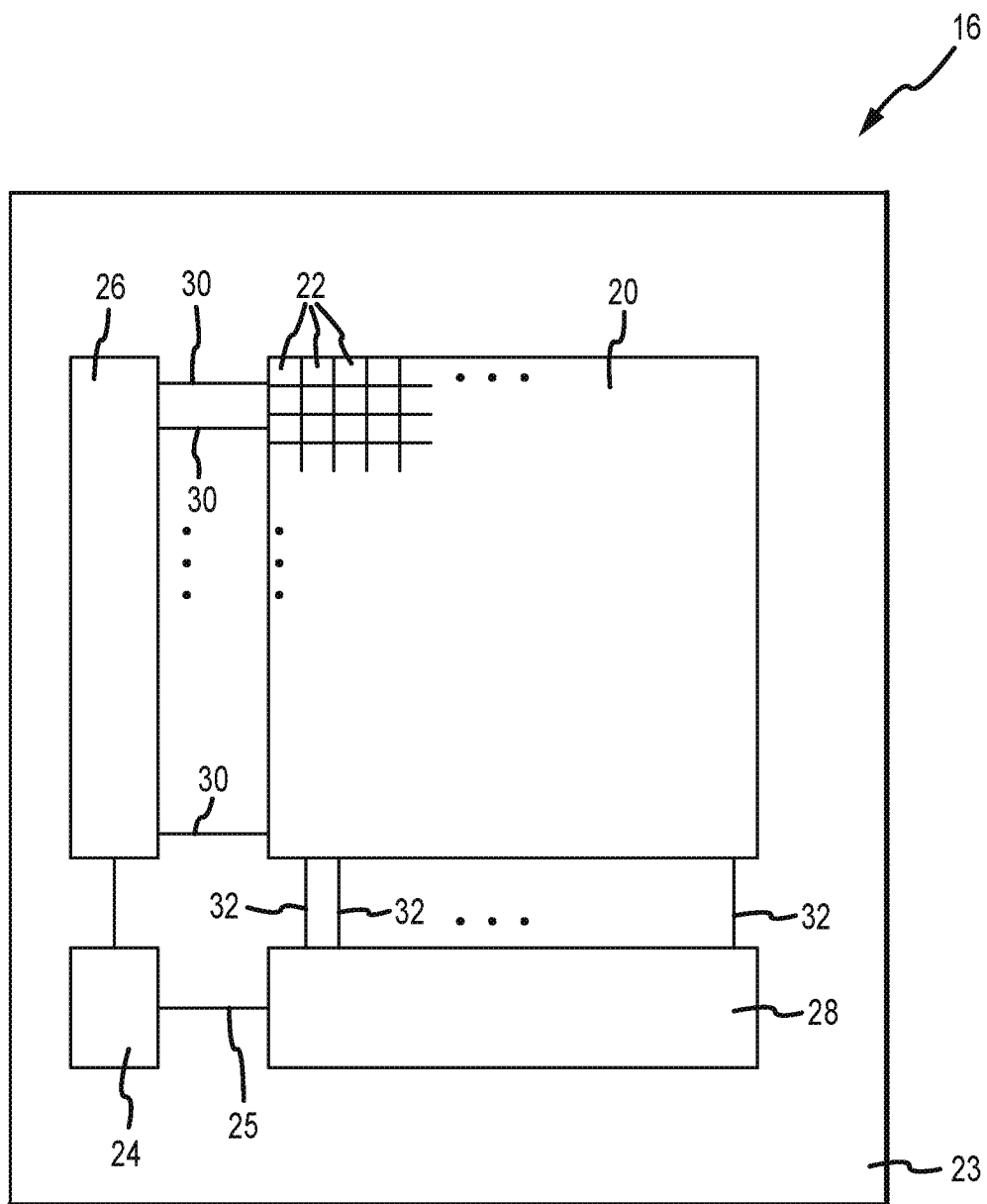
FIG. 2 is a diagram of an illustrative pixel array and associated readout circuitry for reading out image signals from the pixel array in accordance with an embodiment.

As shown in FIG. 2, image sensor 16 may include pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Pixel array 20, control and processing circuitry 24, row control circuitry 26, and image readout circuitry 28 may be formed on a substrate 23. If desired, some or all of the components of image sensor 16 may instead be formed on substrates other than substrate 23, which may be connected to substrate 23, for instance, through wire bonding or flip-chip bonding.

Row control circuitry 26 may receive row addresses from control circuitry 24 and supply corresponding row control signals such as reset, row-select, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 over path 25 for pixels in one or more pixel columns.

Figure 3:
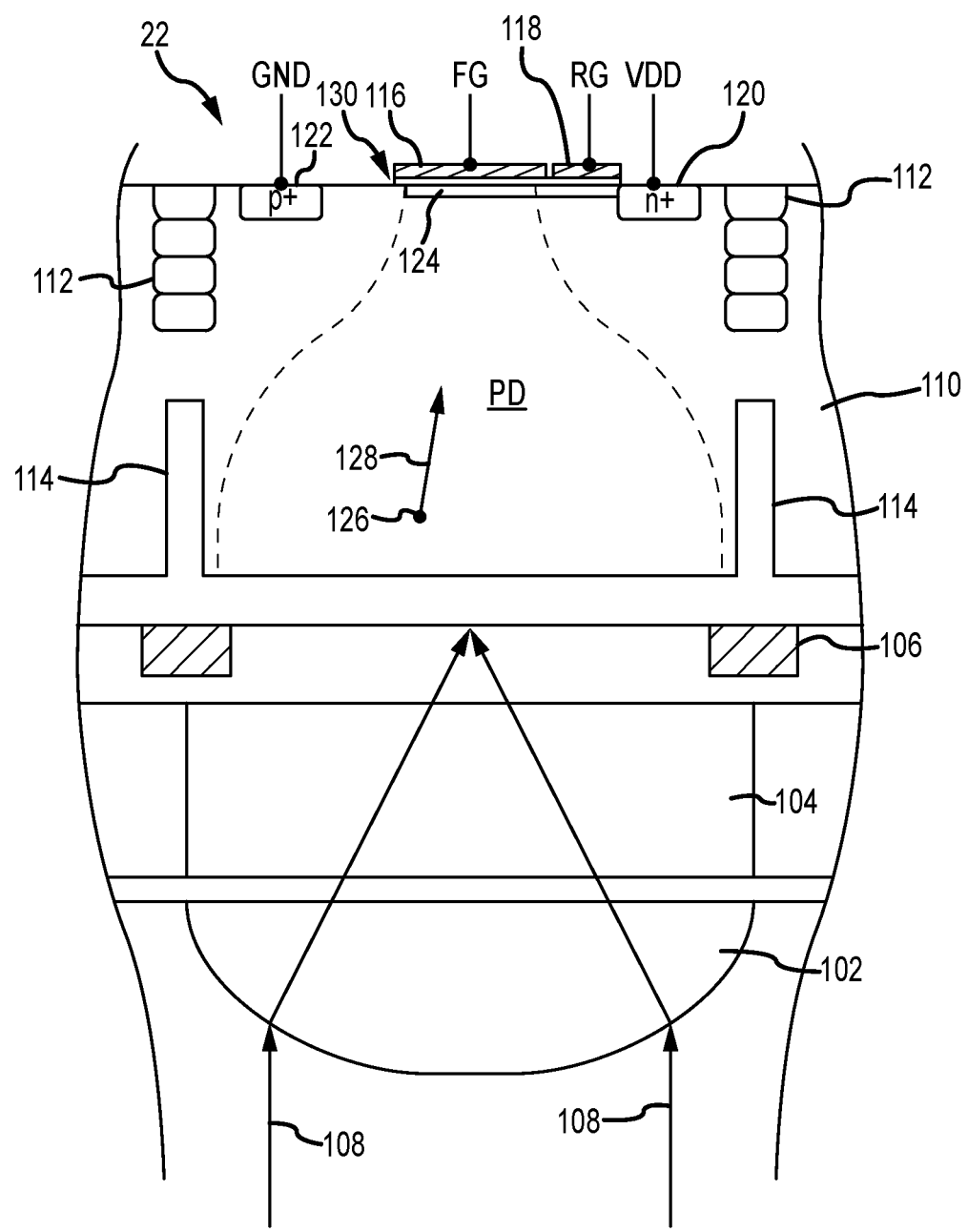
FIG. 3 is a cross-sectional side view of an illustrative imaging pixel having a floating gate for non-destructive readout in accordance with an embodiment.

An illustrative imaging pixel with non-destructive readout capabilities is shown in FIG. 3. As shown in FIG. 3, the imaging pixel may include a microlens 102. Incident light such as light 108 may pass through microlens 102 and color filter element 104 to reach a photosensitive area such as photodiode PD. The photosensitive area may generate charge in response to incident light. The amount of charge generated may be proportional to the amount of incident light received. The microlens may have a curved surface that receives incident light 108 and focuses the light on the photosensitive area. The color filter element 104 may filter incident light by only allowing predetermined wavelengths to pass through the color filter element (e.g., color filter 104 may only be transparent to the certain ranges of wavelengths).

Color filters 104 may include green filters, red filters, blue filters, yellow filters, cyan filters, magenta filters, clear filters, infrared filters, or other types of filters. As an example, a green filter passes green light (e.g., light with wavelengths from 495 nm to 570 nm) and reflects and/or absorbs light out of that range (e.g., the green filter reflects red light and blue light). An example of a color filter array pattern that may be used is the GRBG (green-red-blue-green) Bayer pattern. In this type of configuration, the color filter array is arranged into groups of four color filters. In each group, two of the four color filters are green filters, one of the four color filters is a red filter, and the remaining color filter is a blue filter. If desired, other color filter array patterns may be used.

The photosensitive area PD may be formed form a portion of substrate 110 (e.g., a doped portion of substrate 110). Substrate 110 may be formed from a semiconductor material such as silicon. The substrate may be a p-type substrate and photodiode PD may be formed form n-type doped portions of substrate 110. A light shield 106 (e.g., formed from metal or other material that is opaque to incident light) may be formed on the back surface of the substrate. The light shield may block incident light from reaching an adjacent pixel to prevent cross-talk. Light shield 106 may be reflective or absorptive (e.g., an anti-reflection layer may be formed on the light shield). In FIG. 3, the image sensor is shown as being a backside illuminated (BSI) image sensor. This example is merely illustrative and the image sensor may instead by a front side illuminated (FSI) image sensor.

Additional isolation structures may be incorporated into pixel 22 to prevent electrons generated by stray light (e.g., light that has not passed through the microlens associated with pixel 22) from reaching photodiode PD. For example, pixel 22 may include p-well and shallow trench isolation 112 and/or backside deep trench isolation (BDTI) 114. The p-well isolation may be formed from a p-type doped region of substrate 110. The backside deep trench isolation 114 may be formed from metal or another desired material in a trench formed in the back surface of substrate 110. Both p-well isolation and BDTI 114 may laterally surround photodiode PD.

Planarization layers may be formed on the back surface of substrate 110 between the light shield and the substrate, between the light shield and the color filter element, and/or between the color filter element and the microlens. The planarization layers may be dielectric layers formed from any desired materials (e.g., silicon dioxide, silicon nitride, etc.).

When incident light reaches photosensitive area PD, photoelectrons such as photoelectron 126 are generated. The potential gradient of the substrate leads the electrons to be swept in direction 128 towards an n-type buried channel 124. The electrons may collect in an area of the substrate adjacent to floating gate 116 (FG). A gate oxide 130 may be interposed between floating gate 116 and the front surface of substrate 110 (with buried channel 124). The floating gate and the front surface of the substrate form a capacitor (e.g., with the floating gate acting as one capacitor electrode and the substrate acting as the other capacitor electrode). When charge accumulates in the substrate adjacent to the floating gate, the voltage on the floating gate will decrease. The voltage of the floating gate is therefore indicative of how much light has been received by the pixel. The voltage of the floating gate may be sampled multiple times, as sampling the floating gate voltage does not change the amount of charge in the substrate or the voltage of the floating gate. In other words, the amount of charge accumulated in the substrate may be non-destructively sampled as many times as desired.

Pixel 22 also includes a reset gate 118. Reset gate 118 may be used to clear substrate 110 of charge. When reset gate 118 is asserted, the charge accumulated at the front surface of the substrate may be cleared to drain 120 (sometimes referred to as bias voltage supply terminal 120) formed by an n+ type doped portion of substrate 110. The pixel may also include a reset transistor to reset the voltage of floating gate 116 (as will be shown in FIG. 5). Pixel 22 may also include a ground contact 122 formed by a p+ doped region of substrate 110. The ground contact may receive a ground bias voltage GND.

Figure 4:
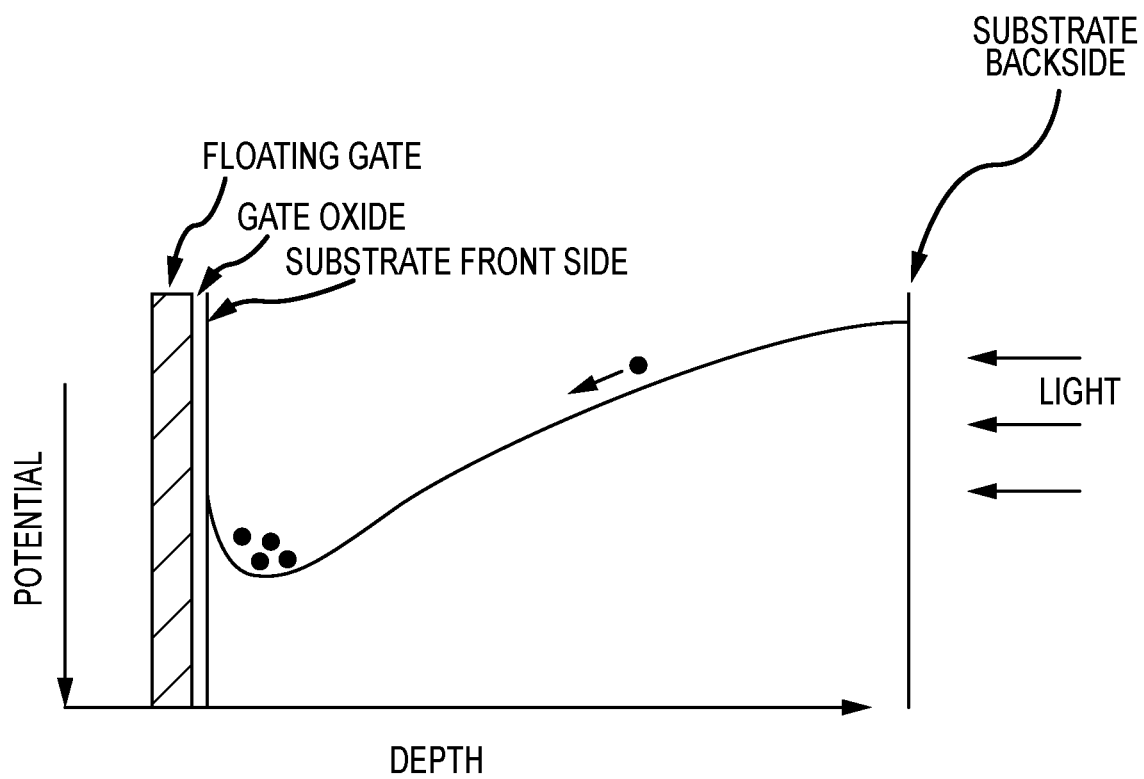
FIG. 4 is a graph showing potential as a function of depth in the substrate of an illustrative imaging pixel having a floating gate such as the imaging pixel of FIG. 3 in accordance with an embodiment.

FIG. 4 is a graph of electric potential versus depth for the pixel of FIG. 3. As shown, the potential may be highest at the backside surface of the substrate (e.g., the surface that receives incident light). The potential may decrease towards the front side of the substrate, meaning that generated electrons are swept towards the front side of the substrate and accumulate at the front surface of the substrate as shown in FIG. 4. Also shown in FIG. 4 are the gate oxide (130) and floating gate (116) adjacent to the front side of the substrate.

Figure 5:
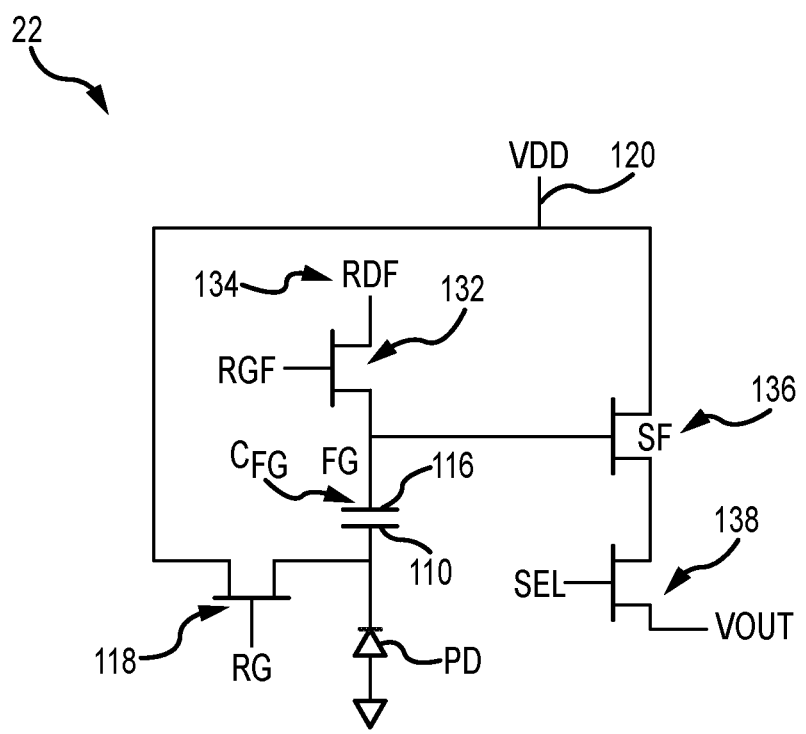
FIG. 5 is a circuit diagram for an illustrative imaging pixel having a floating gate such as the imaging pixel of FIG. 3 in accordance with an embodiment.

FIG. 5 is a circuit diagram of an illustrative imaging pixel 22 having a floating gate for non-destructive readout capabilities. As shown, each imaging pixel includes a photosensitive area such as photodiode PD. Reset gate 118 (sometimes referred to as substrate reset gate 118) is coupled to photodiode PD. When reset gate 118 is asserted, the accumulated charge from photodiode PD (in substrate 110) is cleared to bias voltage supply terminal 120 (VDD). The front surface of the substrate with the photosensitive area forms a portion (e.g., an electrode) of a capacitor ($C_{FG}$). Floating gate 116 forms the other portion (e.g., an electrode) of capacitor $C_{FG}$.

Floating gate 116 is coupled to the gate of source follower transistor 136 (SF). To sample the voltage of floating gate 116, select transistor 138 (sometimes referred to as row select transistor 138) may be asserted. Select transistor 138 may be coupled between source follower transistor 136 and a column readout line. When select transistor 138 is asserted, an output voltage $V_{OUT}$ that corresponds to the voltage on floating gate 116 is provided to the column line.

An additional reset transistor 132 (sometimes referred to as floating gate reset transistor 132) may also be included to reset the voltage of floating gate 116. Reset transistor 132 is coupled between floating gate 116 and a bias voltage supply terminal 134 that provides a floating gate reset voltage RDF. When reset transistor 132 is asserted, the voltage of floating gate 116 is reset to RDF.

Figure 6:
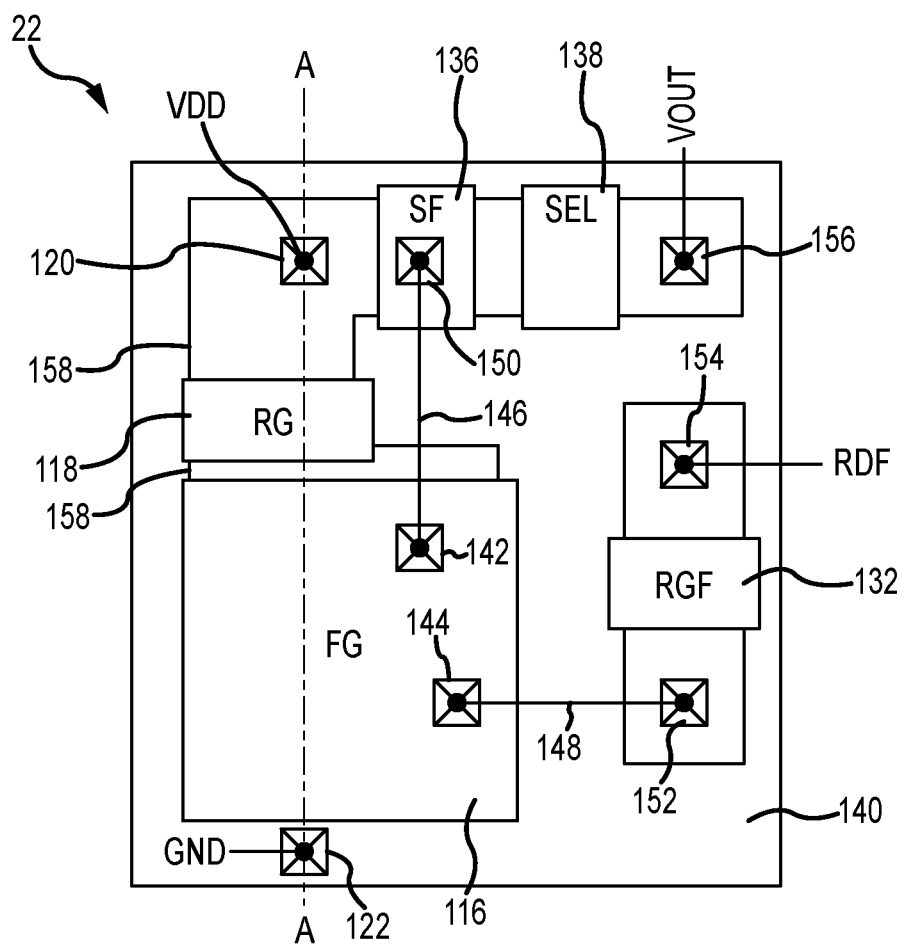
FIG. 6 is a top-view of an illustrative imaging pixel having a floating gate such as the imaging pixel of FIG. 3 in accordance with an embodiment.

FIG. 6 is a top view of an illustrative imaging pixel 22 showing a possible layout for the pixel of FIGS. 3-5. The cross-sectional side view of FIG. 3 may be taken along line AA in FIG. 6. As shown in FIG. 6, pixel 22 has a floating gate 116. The floating gate has a first contact 142 that is electrically connected to a contact 150 (e.g., on the gate of source follower transistor 136) by electrical connection 146. The floating gate has a second contact 144 that is electrically connected to a contact 152 by electrical connection 148. Contact 152 may be optionally coupled to bias voltage supply terminal 154 (for providing reset voltage RDF) by reset transistor 132. Select transistor 138 may be interposed between source follower transistor 136 and an additional contact 156. The additional contact 156 may be coupled to a column output line and may provide output voltage $V_{OUT}$ to the column output line.

Reset gate 118 is interposed between the floating gate and bias voltage supply terminal 120. Active areas 158 of the transistors (e.g., doped portions of substrate 110) underneath the gates allow the reset gate to clear accumulated charge in the substrate under floating gate 116 to bias voltage supply terminal 120. The active areas may optionally be surrounded by shallow trench isolation (STI) 140. The ground contact 122 may also be included adjacent to the floating gate.

The pixel having a floating gate shown in FIGS. 3-6 for non-destructive sampling enables numerous techniques that are not possible with a pixel that uses destructive sampling. Because sampling using the pixel of FIGS. 3-6 is non-destructive, the image may be observed over time. With destructive sampling, once a sample of an integration time is taken, the integration time can no longer be sampled again to obtain meaningful data. Using non-destructive sampling, the amount of light received by a pixel in a given integration time may be repeatedly sampled. This allows for the time at which a pixel becomes saturated to become determined and for dynamic range to be increased. For example, consider two pixels in a single image sensor. The first pixel and second pixel may both receive enough light to saturate the pixel within a given integration time. However, the first pixel may receive more light and saturate sooner than the second pixel. If the sampling was destructive, there would be no way to distinguish between the first and second pixels (because at the time of sampling the amount of light received would appear to be the same saturated level). Using non-destructive sampling, however, the sensor may determine that the first pixel saturated sooner than the second pixel and therefore may determine that the first pixel was exposed to more light than the second pixel. This increases the dynamic range of the image sensor. Repeated sampling of low light images may reduce noise in the signal.

Figure 8:
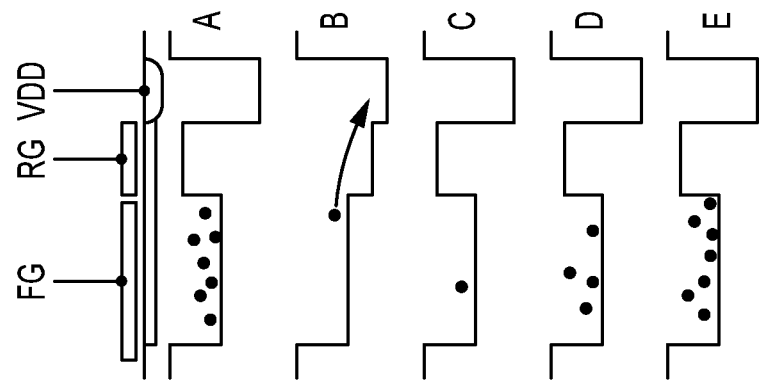
FIG. 8 is a diagram showing the accumulation of charge underneath a floating gate over time in an illustrative imaging pixel having a floating gate such as the imaging pixel of FIG. 3 in accordance with an embodiment.
Figure 7:
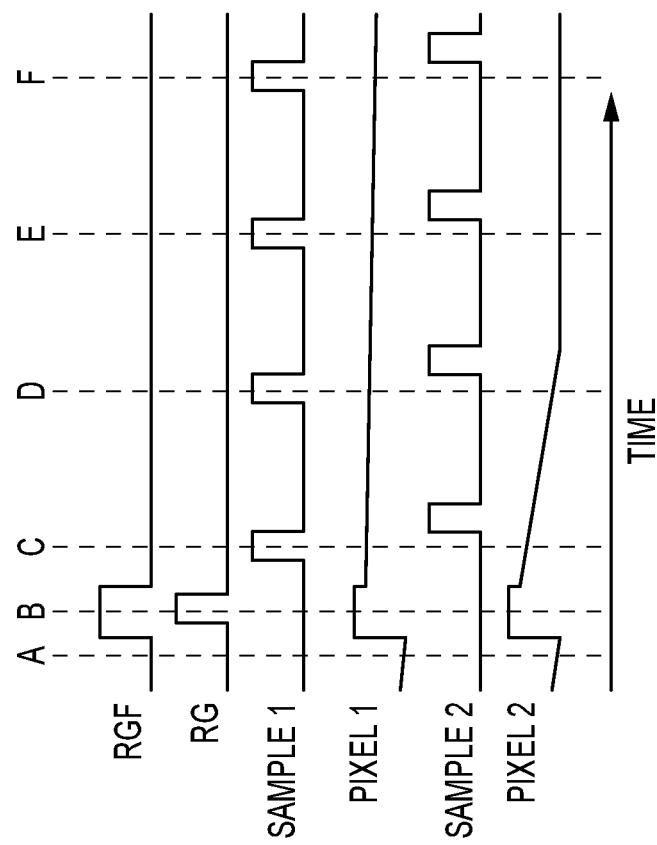
FIG. 7 is a timing diagram showing an illustrative method of operating an imaging pixel having a floating gate such as the imaging pixel of FIG. 3 in accordance with an embodiment.
Figure 9:
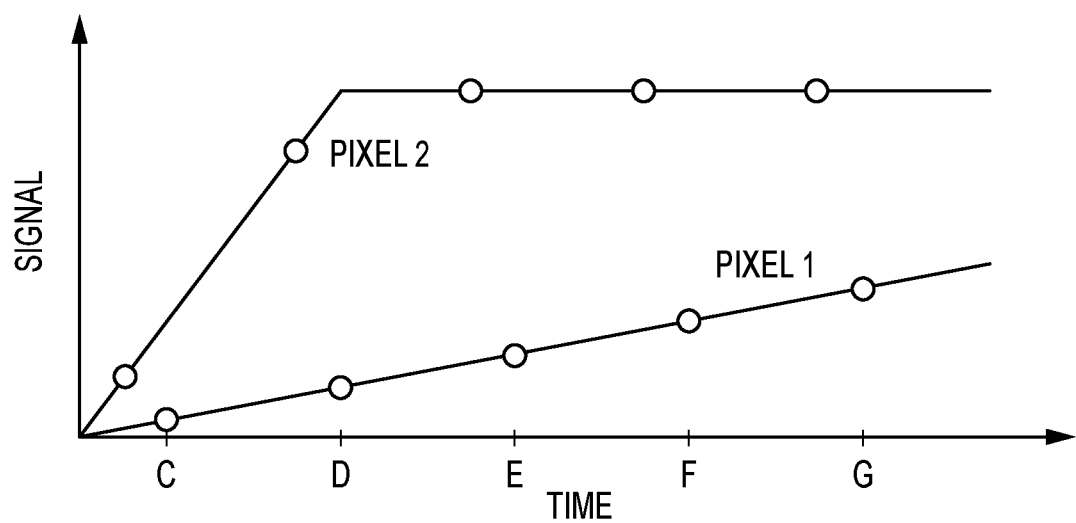
FIG. 9 is a graph showing the pixel signal over time for two illustrative imaging pixels that have floating gates in accordance with an embodiment.

FIGS. 7-9 illustrate operation of a pixel with a floating gate for non-destructive sampling. FIG. 7 is a timing diagram showing various signals within the pixel over time. FIG. 8 is a diagram showing the accumulations of electrons adjacent to the floating gate during operation of the imaging pixel as in FIG. 7. FIG. 9 shows the measured pixel signals versus time for the pixels of FIG. 7.

FIG. 7 shows the operation of imaging pixel 22 beginning at time A. At time A, charge from a previous frame is accumulated adjacent to the floating gate (as shown in FIG. 8). To start the next frame (e.g., to start a subsequent integration time), reset transistors 118 (RG) and 132 (RGF) may be asserted at time B. Asserting reset transistor RGF sets the floating gate voltage of the pixels (e.g., pixel 1 and pixel 2) to a desired voltage value. Asserting reset transistor RG clears the substrate of any charge in substrate 110, as shown in FIG. 8.

After the floating gate voltage is reset and the substrate is cleared of charge at time B, the photosensitive area may generate charge that accumulates adjacent to floating gate FG. As shown in FIG. 8, over time the amount of accumulated charge may increase. The voltage of the floating gate of each pixel (e.g., Pixel 1 and Pixel 2 in FIG. 7) may vary with the amount of charge accumulated in the substrate. For example, looking first at pixel 1, the voltage may slowly drop over time. At time C the voltage of the floating gate of the first pixel may be sampled (e.g., sample 1 may be asserted). The voltage of the floating gate of the first pixel may be sampled repeatedly at any desired interval (at time D, then time E, then time F, etc.). Similarly, the voltage of the floating gate of the second pixel may be sampled (e.g., sample 2 may be asserted). Each sampling of pixel 2 may occur immediately after the sampling of pixel 1 if desired. The voltage of the floating gate of the second pixel may be sampled repeatedly at any desired interval.

FIG. 9 shows how the pixel signal of Pixel 1 and Pixel 2 may vary over time. The 'pixel signal' may correspond to the amount of light received by the given pixel. For pixel 1, the voltage of the floating gate of pixel 1 slowly drops over time (as shown in FIG. 7). Accordingly, the pixel signal for pixel 1 in FIG. 9 slowly increases over time. The signal for pixel 1 increases at a uniform rate. In contrast, for pixel 2, the voltage of the floating gate of pixel 2 drops at a faster rate than pixel 1 (as shown in FIG. 7). The voltage of the floating gate of pixel 2 reaches a minimum value and flattens out, indicating that the photosensitive area is saturated with charge. The corresponding pixel signal for pixel 2 in FIG. 9 increases at a faster rate than pixel 2 then flattens out at around time D.

The dots on the signal lines in FIG. 9 indicate the points at which samples may be taken of the first and second signals. In other words, the voltage of the floating gate of each pixel is sampled repeatedly at known times to determine the amount of light received by the pixel. The slope of the pixel signal lines may be used to determine the intensity of light received by each pixel. For example, the slope of the signal of pixel 2 in FIG. 9 is greater than the slope of pixel 1 in FIG. 9. This accurately reflects that pixel 2 received higher intensity light than pixel 1.

Figure 10:
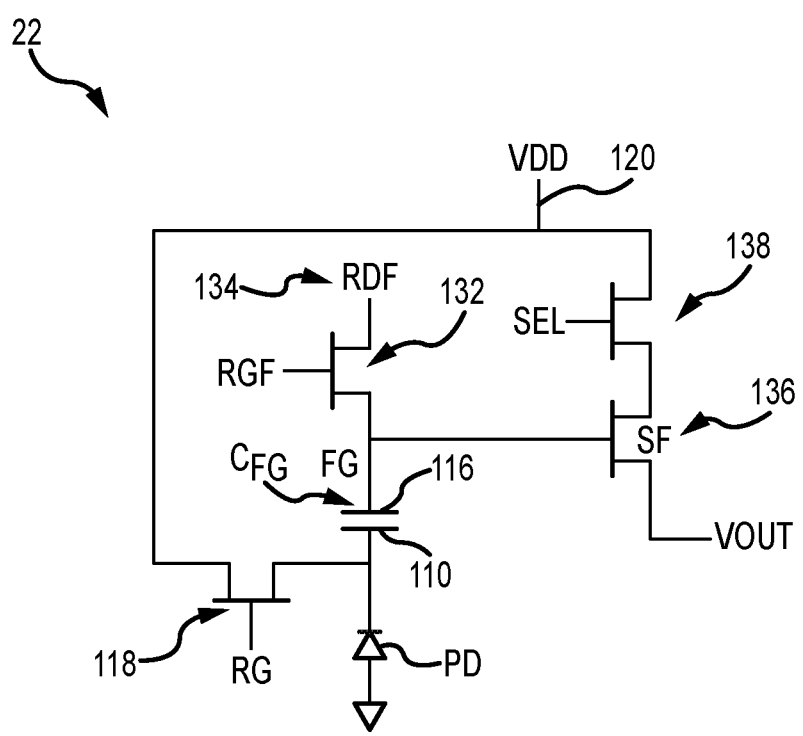
FIG. 10 is a circuit diagram for an illustrative imaging pixel having a floating gate and a row select transistor positioned between a source follower transistor and a bias voltage supply terminal in accordance with an embodiment.
Figure 11:
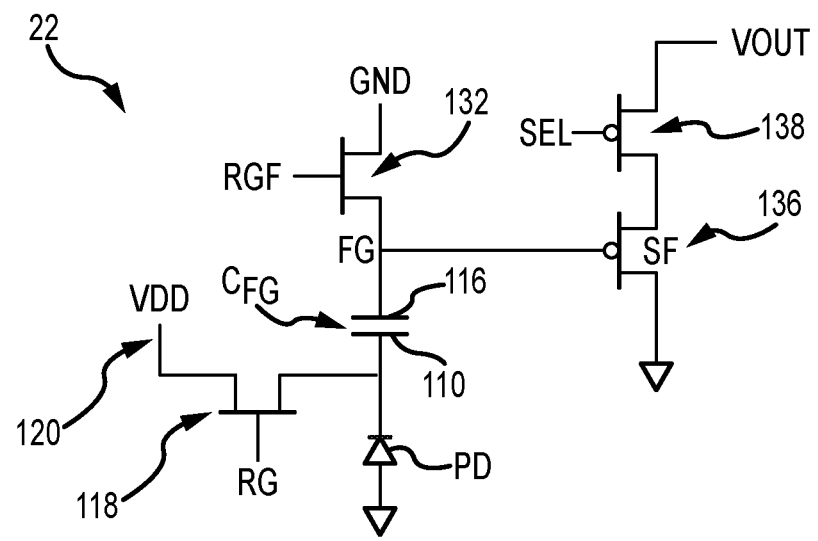
FIG. 11 is a circuit diagram for an illustrative imaging pixel having a floating gate and a pMOS row select transistor positioned between a pMOS source follower transistor and a column output line in accordance with an embodiment.

The pixel diagram shown in FIG. 5 is merely one way to implement a pixel with a floating gate for non-destructive sampling capabilities. FIGS. 10 and 11 show alternative types of pixels with floating gates that may be used. Pixel 22 of FIG. 10 is similar to the pixel of FIG. 5. Pixel 22 has a photodiode PD and a reset gate 118 (sometimes referred to as substrate reset gate 118) coupled to photodiode PD. The reset gate 118 is coupled between the photodiode and bias voltage supply terminal 120. The front surface of the substrate 110 forms a portion (e.g., an electrode) of a capacitor ($C_{FG}$). Floating gate 116 forms the other portion (e.g., an electrode) of capacitor $C_{FG}$. Floating gate 116 is coupled to the gate of source follower transistor 136 (SF).

Instead of select transistor 138 being coupled between source follower transistor 136 and a column output line as in FIG. 5, select transistor may instead be coupled between source follower transistor 136 and bias voltage supply terminal 120 as shown in FIG. 10. The source follower transistor is therefore coupled between select transistor 138 and the column output line. Positioning select transistor 138 between the source follower transistor and the bias voltage supply terminal as in FIG. 10 may allow for FG 116 to operate closer to ground.

In the examples of FIGS. 5 and 10, the transistors are all depicted as n-channel metal-oxide-semiconductor (nMOS) transistors. However, any or all of the transistors may instead be p-channel metal-oxide-semiconductor (pMOS) transistors.

FIG. 11 is a circuit diagram of an illustrative imaging pixel with pMOS transistors. As shown in FIG. 11, pixel 22 has a photodiode PD and a reset gate 118 (sometimes referred to as substrate reset gate 118) coupled to photodiode PD. The reset gate 118 is coupled between the photodiode and bias voltage supply terminal 120. The reset gate is an nMOS transistor.

In FIG. 11, reset transistor 132 is coupled to floating gate 116 (similar to as in FIGS. 5 and 10). However, in FIG. 11, the reset transistor may be coupled to ground GND (e.g., a ground voltage may be supplied as the reference voltage). Reset transistor 132 is also an nMOS transistor.

Floating gate 116 may be coupled to a pMOS source follower transistor 136. The source follower transistor may be coupled between ground and a pMOS row select transistor 138. The pMOS row select transistor may be coupled between the source follower transistor and a column output line. Using the pMOS source follower allows for the floating gate to be reset to zero volts (e.g., GND), which may reduce dark current in the pixel. In some cases, reset transistor 132 in FIG. 11 may also be a pMOS transistor.

In the examples of FIGS. 5, 10, and 11, pixel 22 is depicted as being formed in a single substrate. These examples are merely illustrative. If desired, the pixel may be implemented using multiple substrates that are stacked. The substrates may be electrically connected using metal interconnect layers. One or more interconnect layers in each pixel may be used to connect an upper substrate layer to a lower substrate layer. The interconnect layers may be formed from a conductive material such as metal. In certain embodiments, the interconnect layers may include solder. The interconnect layers may also be a through silicon via (TSV).

Figure 12:
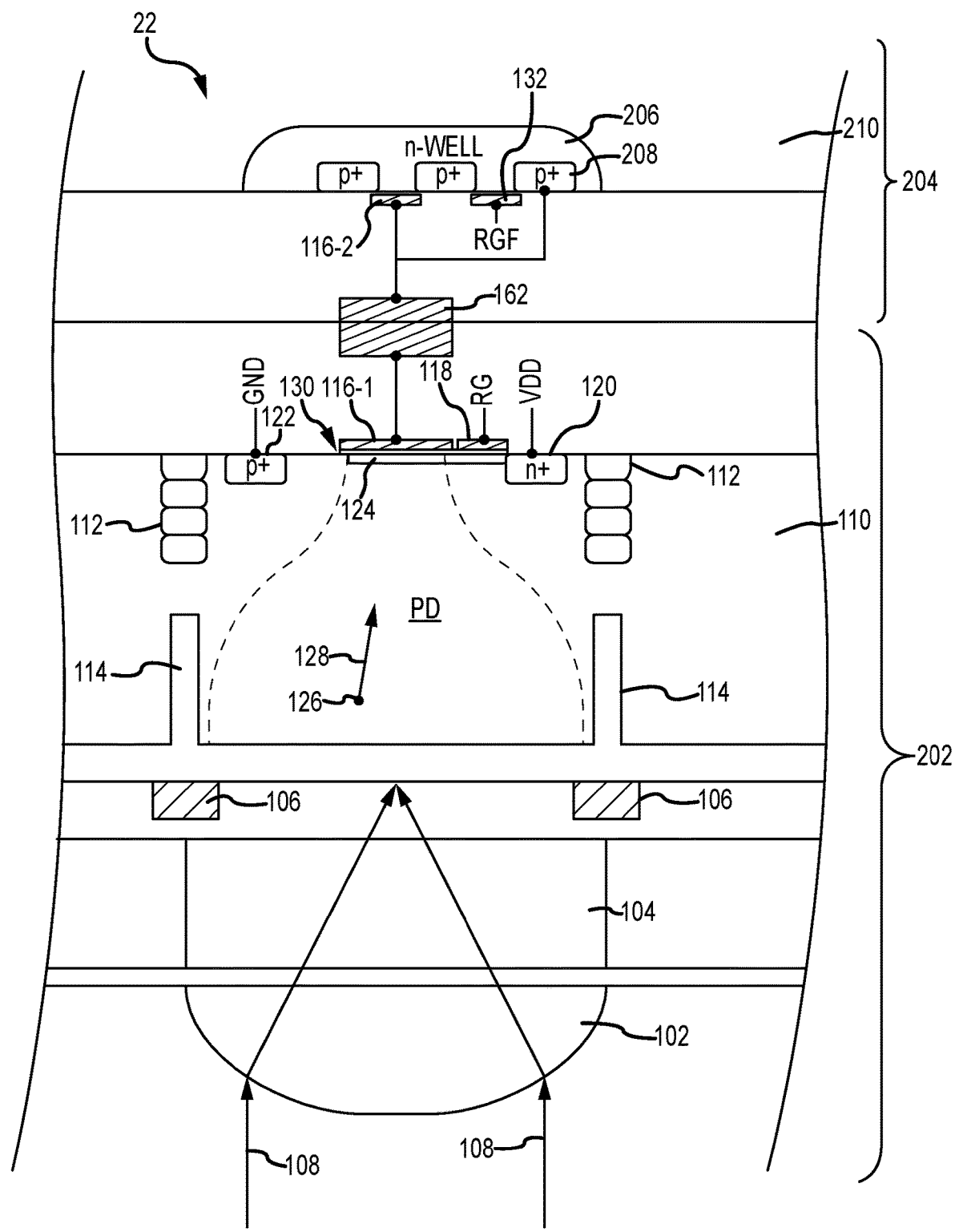
FIG. 12 is a cross-sectional side view of an illustrative imaging pixel having a floating gate for non-destructive readout that is split between two wafers in accordance with an embodiment.

A cross-sectional side view of an illustrative imaging pixel with non-destructive readout capabilities formed from stacked wafers is shown in FIG. 12. As shown in FIG. 12, the imaging pixel includes a microlens 102. Incident light such as light 108 may pass through microlens 102 and color filter element 104 to reach a photosensitive area such as photodiode PD. The microlens may have a curved surface that receives incident light 108 and focuses the light on the photodiode. The color filter element 104 may filter incident light by only allowing predetermined wavelengths to pass through the color filter element (e.g., color filter 104 may only be transparent to the certain ranges of wavelengths).

Color filters 104 may include green filters, red filters, blue filters, yellow filters, cyan filters, magenta filters, clear filters, infrared filters, or other types of filters. As an example, a green filter passes green light (e.g., light with wavelengths from 495 nm to 570 nm) and reflects and/or absorbs light out of that range (e.g., the green filter reflects red light and blue light). An example of a color filter array pattern that may be used is the GRBG (green-red-blue-green) Bayer pattern. In this type of configuration, the color filter array is arranged into groups of four color filters. In each group, two of the four color filters are green filters, one of the four color filters is a red filter, and the remaining color filter is a blue filter. If desired, other color filter array patterns may be used.

In FIG. 3, a single wafer is used to form the imaging pixel. In contrast, in FIG. 12 first and second wafers 202 and 204 that are connected by metal interconnect layer 162 are used to form the imaging pixel. Wafer 202 may include a p-type substrate 110 that forms photosensitive area PD and therefore may sometimes be referred to as sensor wafer 202. Wafer 204 may be used to form pixel circuitry for operating pixel 22 and may therefore sometimes be referred to as circuit wafer 204.

Photodiode PD may be formed form a doped portion of substrate 110 in wafer 202. The substrate may be a p-type substrate and photodiode PD may be formed form n-type doped portions of substrate 110. A light shield 106 (e.g., formed from metal or other material that is opaque to incident light) may be formed on the back surface of the substrate. Light shield 106 may be reflective or absorptive (e.g., an anti-reflection layer may be formed on the light shield).

Additional isolation structures may be incorporated into pixel 22 to prevent stray light (e.g., light that has not passed through the microlens associated with pixel 22) from reaching photodiode PD. For example, pixel 22 may include p-well and shallow trench isolation 112 and/or backside deep trench isolation (BDTI) 114.

When incident light reaches photodiode PD, photoelectrons such as photoelectron 126 are generated. The potential gradient of the photodiode leads the electrons to be swept in direction 128 towards a front surface of substrate 110 (adjacent n-buried channel 124). The electrons may collect in an area of the substrate adjacent to floating gate 116 (FG). A gate oxide 130 may be interposed between floating gate portion 116-1 and the front surface of substrate 110 (with buried channel 124).

In FIG. 12, the floating gate has a first portion 116-1 in the first wafer 202 (sometimes referred to as substrate 202 or layer 202) and a second portion 116-2 in the second wafer 204 (sometimes referred to as substrate 204 or layer 204). Floating gate portion 116-1 is electrically connected to floating gate portion 116-2 through interconnect layer 162. Floating gate portions 116-1 and 116-2 may collectively be referred to as floating gate 116. Floating gate portion 116-2 may also be omitted if desired.

Floating gate portion 116-2 in wafer 204 may be adjacent to reset transistor 132 for resetting the voltage of the floating gate. Wafer 204 includes a p-type substrate 210 that has an n-well 206 and p+ regions 208 used to form the transistors in wafer 204.

Pixel 22 also includes a reset gate 118 in wafer 202. Reset gate 118 may be used to clear substrate 110 of charge. When reset gate 118 is asserted, the charge accumulated at the front surface of the substrate may be cleared to drain 120 formed by an n+ type doped portion of substrate 110. Pixel 22 may also include a ground contact 122 formed by a p+ doped region of substrate 110.

Figure 13:
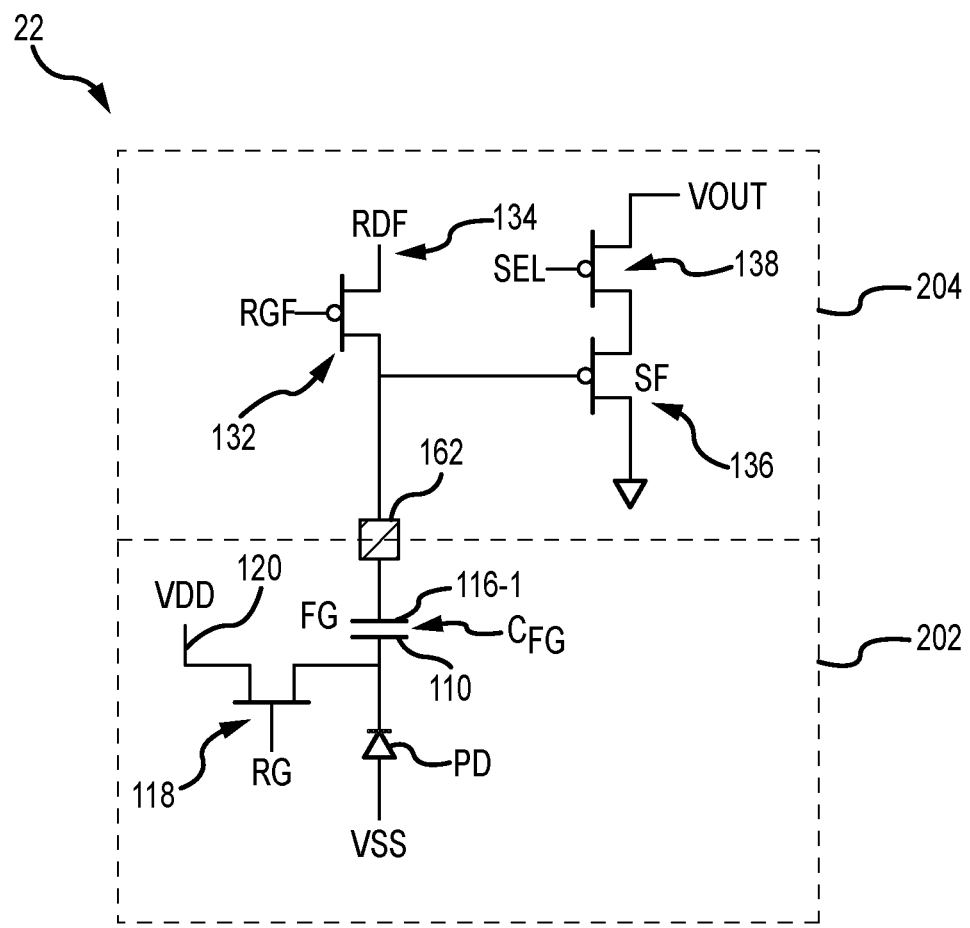
FIG. 13 is a circuit diagram for an illustrative imaging pixel having a floating gate that is split between two wafers such as the imaging pixel of FIG. 12 in accordance with an embodiment.

FIG. 13 is a circuit diagram of the pixel of FIG. 12 that includes an interconnect layer between two wafers. As shown in FIG. 13, the pixel of FIG. 13 is similar to the pixel of FIG. 11. As shown in FIG. 13, pixel 22 has a photodiode PD and a reset gate 118 (sometimes referred to as substrate reset gate 118) coupled to photodiode PD. The reset gate 118 is coupled between the photodiode and bias voltage supply terminal 120. The reset gate is an nMOS transistor. Photodiode PD may optionally be coupled to a bias voltage $V_{SS}$ that is above the ground voltage.

As shown in FIG. 13, floating gate portion 116-1 and substrate 110 form a capacitor $C_{FG}$. Floating gate portion 116-1 is coupled to interconnect 162. Wafer 204 includes a pMOS reset transistor 132 that is coupled between the floating gate and bias voltage supply terminal 134. The floating gate is also coupled to the gate of pMOS source follower transistor 136. The source follower transistor may be coupled between ground and a pMOS row select transistor 138. The pMOS row select transistor may be coupled between the source follower transistor and a column output line.

In the arrangement of FIG. 13, all of the transistors in wafer 202 are of the same type (e.g., nMOS) and all of the transistors in wafer 204 are of the same type (e.g., pMOS). Having transistors of the same type in a single wafer may reduce cost and complexity of manufacturing. The example of a location within the pixel circuit for interconnect 162 in FIG. 13 is merely illustrative. One or more interconnects may be included at any desired locations within the pixel circuit.

If desired, pixel 22 may be provided with global shutter capabilities. In a global shutter, every pixel in the image sensor may simultaneously capture an image, whereas in a rolling shutter each row of pixels may sequentially capture an image. Global shutter functionality may require including an additional charge storage region in the pixel, as shown in FIG. 14.

Figure 14:
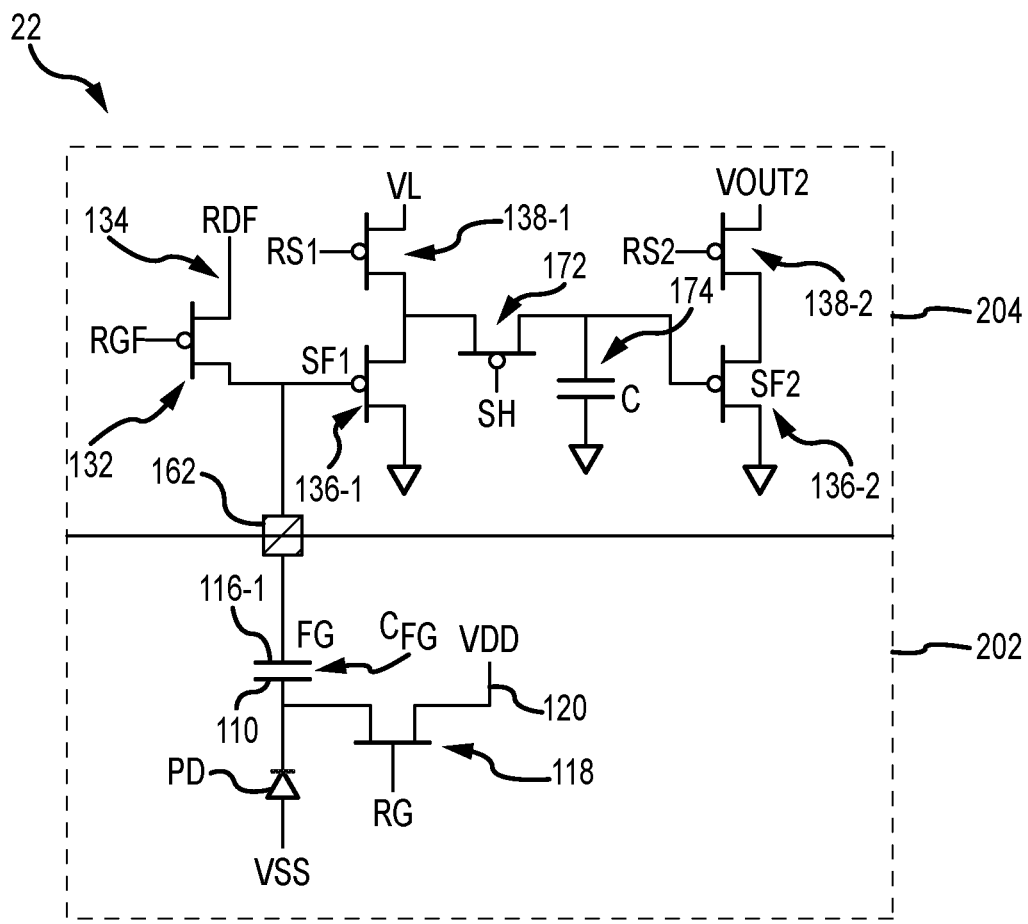
FIG. 14 is a circuit diagram for an illustrative imaging pixel having a floating gate that is split between two wafers and global shutter capabilities in accordance with an embodiment.

FIG. 14 is a circuit diagram of an illustrative imaging pixel having a floating gate for non-destructive sampling, an interconnect layer, and global shutter capabilities. The pixel of FIG. 14 is similar to the pixel of FIG. 13. The arrangement of the pixel circuitry in wafer 202 is the same in FIG. 14 as in FIG. 13.

In wafer 204 of FIG. 14, reset transistor 132 is coupled between metal interconnect layer 162 and bias voltage supply terminal 134. Interconnect layer 162 may also couple the floating gate to source follower transistor 136-1 (SF1). Because pixel 22 in FIG. 14 is a global shutter pixel, an additional charge storage region 174 is included. In FIG. 14, charge storage region 174 is shown as being a storage capacitor C. However, charge storage region 174 may instead be a storage diode, storage gate, or any other desired charge storage region.

A sampling transistor 172 is interposed between SF1 and capacitor 174. When sampling transistor 172 is asserted, a voltage corresponding to the voltage of floating gate FG will be stored on capacitor C. Sampling transistor 172 may be asserted globally for all of the pixels in the image sensor. The voltage on capacitor C may then be read out on a row-by-row basis using source follow transistor 136-2 (SF2) and row select transistor 138-2 (RS2). Row select transistor 138-2 may be interposed between source follower transistor 136-2 and a column output line.

An additional row select transistor 138-1 may be included between source follower transistor 136-1 and current load VL. Row select transistor 138-1 may optionally be included in the pixel as a way to conserve power in the image sensor. For example, row select transistor 138-1 may be turned off to turn off the current flow and conserve power in rows where the source follower transistor 136-1 is not being used.

The reference voltage sample may be taken last when operating the pixel of FIG. 14. For example, after the image signals have been sampled any desired number of times (e.g., during the integration time), the floating gate may be reset to a reference voltage that is sampled. Because the channel under the floating gate will be fully depleted of charge when reset, the floating gate will return to the same voltage after being reset. This allows for the reset voltage to be sampled after the signal voltages during the integration time are sampled.

In the image sensor that includes pixels with floating gates for non-destructive sampling, readout may be performed on a line-by-line basis. However, this readout scheme may limit the flexibility of the image sensors. Because of the non-destructive sampling capabilities previously discussed, the image sensor may be able to determine when a pixel has saturated. Pixels within a single row may receive different amounts of light. Therefore, it may be desirable to be able to individually control each pixel within the array. In other words, instead of having to read or reset an entire row of pixels at once, it may instead be desirable to be able to read or reset a single pixel within the array without affecting the other pixels.

To implement per-pixel control, a given transistor may be replaced by a vertical transistor and a horizontal transistor. The horizontal transistor receives a horizontal control signal whereas the vertical transistor receives a vertical control signal. The same horizontal control signal may be applied to every pixel in a particular row, whereas the same vertical anti-blooming control signal may be applied to every pixel in a particular column. Only if both the horizontal and vertical transistors are asserted will the transistor effectively be asserted.

Figure 15:
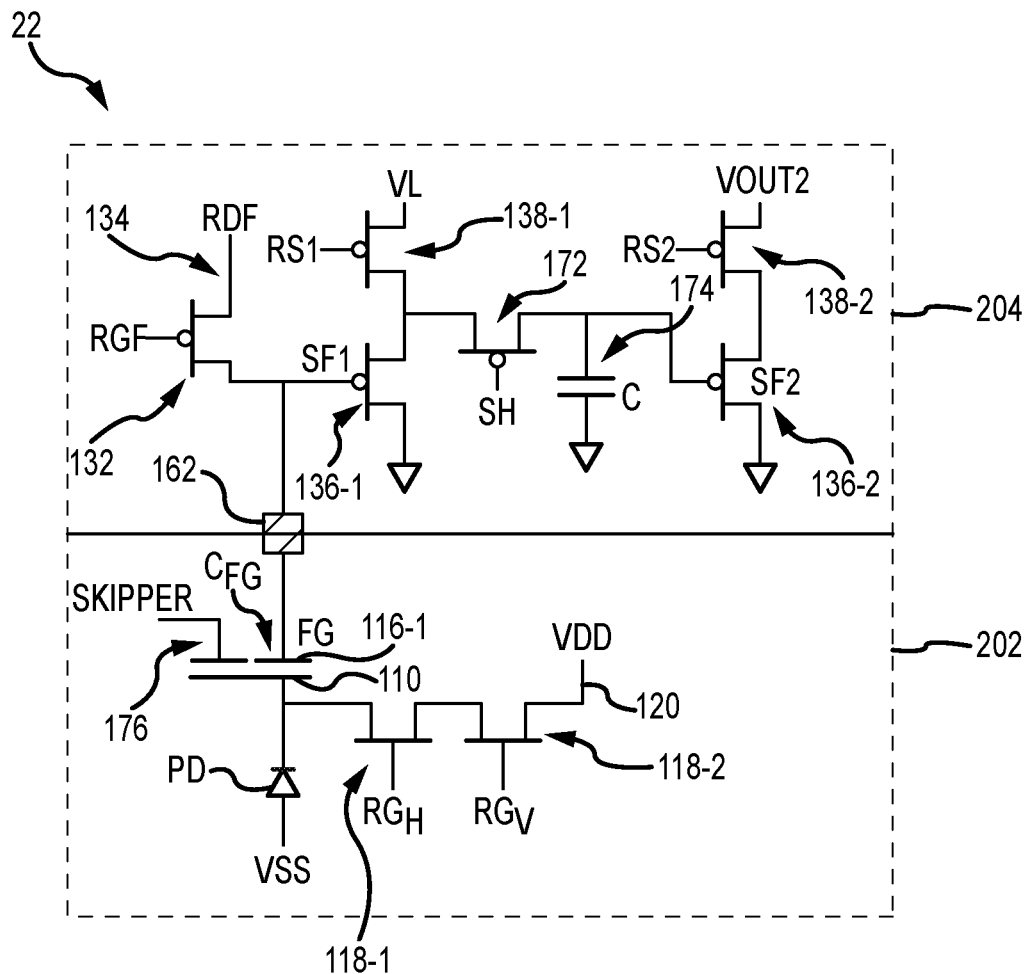
FIG. 15 is a circuit diagram for an illustrative imaging pixel showing both a skipper transistor and a transistor that is split for per-pixel control in accordance with an embodiment.

For example, consider the example shown in FIG. 15. The pixel of FIG. 15 is similar to the pixel in FIG. 14. However, reset transistor 118 has been split into a horizontal reset transistor 118-1 ($RG_H$) and a vertical reset transistor 118-2 ($RG_V$). If neither $RG_H$ nor $RG_V$ are asserted, charge will not be cleared from photodiode PD. Similarly, if only $RG_H$ is asserted, or if only $RG_V$ is asserted, charge will not be cleared from photodiode PD. Only if $RG_H$ and $RG_V$ are both asserted will charge be cleared from photodiode PD. Therefore, if it is desired to clear charge from this pixel, the horizontal control signal associated with the given row of the pixel and the vertical control signal associated with the given column of the pixel may both be asserted. Other pixels in the row/column will not necessarily be reset. For example, an adjacent pixel in the same row will have its $RG_H$ asserted, but only if its $RG_V$ is also asserted would that pixel be reset.

FIG. 15 depicts reset transistor 118 as being split into a horizontal reset transistor and vertical transistor for per-pixel control. This example is merely illustrative. In general, any of the transistors in pixel 22 (e.g., reset transistor 132, sampling transistor 172) may also be split into two transistors for per-pixel control.

FIG. 15 also shows how a skipper transistor may be included in pixel 22 adjacent to the floating gate. When skipper transistor 176 is asserted, the accumulated charge in substrate 110 may be moved from under the floating gate to under the skipper transistor. By moving the charge out from under the floating gate, the voltage of floating gate 116 without charge present in substrate 110 may be sampled and/or reset. Then, the skipper transistor is deasserted, the charge returns to beneath the floating gate, and the voltage of the floating gate reflects the amount of charge in the substrate and can be sampled. This effectively allows noise to be reduced in each sampling of the floating gate.

The foregoing is merely illustrative of the principles of this invention and various modifications can be made by those skilled in the art without departing from the scope and spirit of the invention.

What is claimed is:

1. An image sensor comprising:
   a semiconductor substrate having first and second opposing surfaces;
   a photosensitive area in the semiconductor substrate, wherein the photosensitive area is configured to generate charge in response to incident light during an integration period;
   a floating gate formed adjacent to the first surface of the semiconductor substrate, wherein the floating gate and the photosensitive area overlap and wherein the charge generated by the photosensitive area accumulates at the first surface of the semiconductor substrate adjacent to the floating gate; and
   a source follower transistor, wherein the floating gate is electrically connected to a gate of the source follower transistor.

2. The image sensor defined in claim 1, further comprising:
   readout circuitry configured to sample a voltage of the floating gate multiple times within the integration period.

3. The image sensor defined in claim 2, wherein the readout circuitry is further configured to sample a reset voltage of the floating gate after sampling the voltage of the floating gate multiple times within the integration period.

4. The image sensor defined in claim 1, further comprising:
   gate oxide formed on the first surface, wherein the floating gate is formed on the gate oxide.

5. The image sensor defined in claim 1, further comprising:
   a reset transistor formed adjacent to the floating gate adjacent to the first surface of the semiconductor substrate, wherein the reset transistor has a gate, wherein the gate and the photosensitive area overlap, and wherein the gate and the floating gate are coplanar.

6. The image sensor defined in claim 5, wherein the reset transistor is configured to clear the photosensitive area of accumulated charge.

7. The image sensor defined in claim 5, wherein the reset transistor is an n-channel metal-oxide-semiconductor transistor and the source follower transistor is a p-channel metal-oxide-semiconductor transistor.

8. The image sensor defined in claim 7, wherein the source follower transistor is formed in an additional semiconductor substrate that is connected to the first semiconductor substrate with a conductive interconnect layer.

9. The image sensor defined in claim 1, further comprising:
   a reset transistor coupled between the floating gate and a bias voltage supply terminal, wherein the reset transistor is configured to reset a voltage of the floating gate.

10. An image sensor comprising:
    a substrate having first and second opposing sides;
    a photosensitive area in the substrate that is configured to generate charge in response to incident light during an integration time;
    a floating gate on the first side of the substrate, wherein the charge generated by the photosensitive area accumulates in the substrate adjacent to the floating gate;
    a source follower transistor, wherein the floating gate is electrically connected to a gate of the source follower transistor;
    a reset transistor formed adjacent to the floating gate on the first side of the substrate; and
    readout circuitry configured to sample a voltage of the floating gate multiple times during the integration time, wherein the reset transistor is an n-channel metal-oxide-semiconductor transistor and the source follower transistor is a p-channel metal-oxide-semiconductor transistor.

11. The image sensor defined in claim 10, wherein the voltage of the floating gate is dependent upon an amount of charge accumulated in the substrate adjacent to the floating gate.

12. The image sensor defined in claim 10, wherein the reset transistor is a first reset transistor that is configured to clear the charge accumulated in the substrate, the image sensor further comprising:
a second reset transistor configured to reset the voltage of the floating gate.

13. The image sensor defined in claim 12, wherein the first reset transistor has a gate that is formed adjacent the floating gate on the first side of the substrate and wherein the gate of the first reset transistor and the floating gate are formed over a buried channel on the first side of the substrate.

14. The image sensor defined in claim 13, wherein the second reset transistor is coupled between the floating gate and a bias voltage supply terminal.

15. An image sensor comprising:
a first substrate;
a photosensitive area formed in the first substrate;
a floating gate adjacent to the photosensitive area in the first substrate;
a second substrate;
a source follower transistor in the second substrate; and
a metal interconnect layer between the first and second substrates that electrically connects the floating gate in the first substrate to a gate of the source follower transistor in the second substrate.

16. The image sensor defined in claim 15, further comprising:
a first reset transistor in the first substrate configured to clear charge from the photosensitive area; and
a second reset transistor in the second substrate configured to reset a voltage of the floating gate.

17. The image sensor defined in claim 16, wherein the first reset transistor is an n-channel metal-oxide-semiconductor transistor, wherein the second reset transistor is a p-channel metal-oxide-semiconductor transistor, and wherein the source follower transistor is a p-channel metal-oxide-semiconductor transistor.

18. The image sensor defined in claim 17, further comprising:
a capacitor in the second substrate;
a sampling transistor coupled between the source follower transistor and the capacitor.

19. The image sensor defined in claim 18, further comprising:
a first row select transistor coupled to the source follower transistor, wherein the sampling transistor is a p-channel metal-oxide-semiconductor transistor and the first row select transistor is a p-channel metal-oxide-semiconductor transistor;
an additional source follower transistor, wherein the capacitor is coupled between the sampling transistor and the additional source follower transistor and wherein the additional source follower transistor is a p-channel metal-oxide-semiconductor transistor; and
a second row select transistor coupled to the additional source follower transistor, wherein the second row select transistor is a p-channel metal-oxide-semiconductor transistor.

20. The image sensor defined in claim 15, further comprising:
readout circuitry configured to sample a voltage of the floating gate multiple times within an integration period.

21. The image sensor defined in claim 1, wherein the photosensitive area comprises a photodiode having a potential gradient that sweeps the charge generated by the photodiode to the first surface of the semiconductor substrate adjacent to the floating gate.

* * * * *